United States Patent [19]

Helms

[11] Patent Number: 4,813,846

[45] Date of Patent: Mar. 21, 1989

[54] INSERTING DEVICE FOR VACUUM APPARATUS

[75] Inventor: Dirk Helms, Ahrensburg, Fed. Rep. of Germany

[73] Assignee: Leybold-Heraeus GmbH, Cologne, Fed. Rep. of Germany

[21] Appl. No.: 43,688

[22] Filed: Apr. 29, 1987

[30] Foreign Application Priority Data

Feb. 13, 1987 [DE] Fed. Rep. of Germany ....... 3704505

[51] Int. Cl.$^4$ .............................................. B25J 9/12
[52] U.S. Cl. ..................................... 414/744.1; 74/52; 74/665 E; 901/15; 901/23
[58] Field of Search ............ 414/744 R, 744 AC, 749, 414/751–753, 589–590; 74/52, 479, 665 A, 665 E; 901/15, 23

[56] References Cited

U.S. PATENT DOCUMENTS

| | | | |
|---|---|---|---|
| 1,500,988 | 7/1924 | Goldschmidt | 74/52 X |
| 1,811,832 | 6/1931 | Mayers | 414/744 A |
| 3,010,587 | 11/1961 | Hollinger | 414/744 A |
| 3,240,360 | 3/1966 | Richards | 414/744 A |
| 3,401,568 | 9/1968 | Blatt | 74/52 X |
| 4,392,776 | 7/1983 | Shum | 414/744 R |
| 4,466,770 | 8/1984 | Peroutky | 414/749 X |
| 4,483,654 | 1/1984 | Koch et al. | 414/744 R |
| 4,584,045 | 4/1986 | Richards | 414/744 R X |
| 4,693,666 | 9/1987 | Garin | 414/744 R |
| 4,728,252 | 3/1988 | Lada et al. | 414/744 R |

FOREIGN PATENT DOCUMENTS

| | | |
|---|---|---|
| 2831076 | 1/1980 | Fed. Rep. of Germany . |
| 3511531 | 10/1986 | Fed. Rep. of Germany ... 414/744 R |
| 3714045 | 11/1987 | Fed. Rep. of Germany . |
| 209588 | 5/1984 | German Democratic Rep. . |
| 1116246 | 9/1984 | U.S.S.R. .................................. 74/52 |
| 2022046 | 12/1979 | United Kingdom ................ 414/749 |

Primary Examiner—Leslie J. Paperner
Attorney, Agent, or Firm—Felfe & Lynch

[57] ABSTRACT

An inserter for vacuum installations has a two-part arm provided with a driving and, a single joint and an end for holding an object. The arm can turn in at least one horizontal plane about a vertical main axis disposed in the area of the driving end, and has at least one motor for moving the arm about the main axis and changing the angle between the parts of the arm at the joint. This inserter is constructed such that: (a) the main axis is surrounded by a housing in which an outer hollow shaft is rotatably disposed, with a central shaft coaxial therewith, the outer hollow shaft being co-rotational with the drive end of the lever and with the central shaft, there being a transmission mechanism which acts on a rotatable stubshaft belonging to the joint and supporting the outer part of the lever which has the holding end; (b) one independently operated motor is connected with the hollow shaft and another is connected with the central shaft for respective independent rotation of these parts; (c) the inner part of the lever is in the form of a hermetically sealed hollow body containing the mechanism that couples the central shaft to the subshaft; and (d) the bearings of the hollow shaft and stubshaft are sealed from the interior of the vacuum system by at least low-friction, preferably friction-free, sealing elements.

5 Claims, 3 Drawing Sheets

INSERTING DEVICE FOR VACUUM APPARATUS

BACKGROUND OF THE INVENTION

The invention relates to an inserter for vacuum installations, having a bipartite arm provided with a driving end, a single joint and an end for holding an object. The arm can turn in at least one horizontal plane about a vertical main axis disposed in the area of the driving end, and has at least one motor for moving the arm about the main axis and changing the angle between the parts of the arm at the joint.

In printed literature of Brooks Automation of North Billerica, Mass., U.S.A., an inserter of the kind described above is disclosed, in which two bipartite arms are disposed with a main axis on a rotatable platform in a mirror-image arrangement, and are articulated at their outer ends to a carrier plate for the transport of wafers. The driving ends of the two arms are mounted each over a shaft in the platform, while the two shafts are spaced apart from one another. Roughly speaking, the two jointed arms form a parallelogram, which can also be seen as a section of a scissors drive. By the appropriate control and superimposition of radial and tangential movements, a circular area can be swept by this known system, although the entire mass has to be accelerated and retarded each time the system performs a turning movement. Also, the system has a great number of pivots and joints which are disposed within the vacuum and therefore are difficult to lubricate. For this reason, and on account of the many joints and bearings, wear inevitably occurs, which is an extremely undesirable factor in numerous production processes.

The published German patent application No. 24 02 026 has disclosed a linear crank drive in which the two equally long parts of a bipartite lever are driven with a transmission ratio of 2:1 by a common drive, so that a point "P" of the application of power to the free end of the lever will perform an always rectilinear movement. By rotating the entire system it is possible to address all points within a circular area. Owing to the positive coupling of the two parts of the single lever, however, it is not possible in case of necessity to perform movements independent of one another of the two parts of the lever. If such a linear drive is disposed in a vacuum, as it is intended to be, the majority of all the joints, including the drive parts for the positive correlation of the movements are disposed in the vacuum. Sliding movements are avoided, but rolling movements take place, so that such a system cannot be used in vacuum installations which serve, for example, for the production of integrated semiconductor circuits.

In the manufacture of integrated semiconductor circuits, wafers are subjected to a multi-step process (metallizing, etching, oxidation) in a vacuum. The wafers pass successively through several processing chambers in which the actual processing is performed. An important problem involved in this production process is created by dust particles which settle on the wafer and then result in faults in the circuits. The entry of dust particles from the outside and their production inside of the apparatus must therefore be prevented insofar as possible. Dust is formed inside of the apparatus by surface wear between moving parts, since reliable lubrication in the vacuum is virtually impossible. A decisive factor in the success of such an apparatus, therefore, is a wafer transport mechanism which involves the lowest possible number of components subject to wear. This requirement is further complicated by the working temperatures commonly involved, of about 250° to 300° C.

Furthermore, it is desirable that the transport movement of the wafers be as free as possible of vibration, since the wafers are very brittle, especially in sizes of 200 mm and more. Also the reliability and therefore the simplicity of the transport mechanism must satisfy stringent requirements allowing no more than one error to about 10,000 movements. Since the wafer processing systems must be set up in extremely clean rooms, they must occupy a minimum of space, since the cost of construction and maintenance per unit area is very high. The chief requirements of a multi-chamber system for the processing of wafers relate not only to the working process itself, but also safety of operation, freedom from foreign particles and compactness of the parts of the mechanical transport system.

The present invention therefore addresses the problem of devising an inserter of the kind described above, whereby delicate objects can be transported in a simple, safe and contamination-free manner between the various stations of a vacuum system.

Stations, in this sense, are the process chambers themselves, in which processes such as plasma etching, oxidizing and metallizing, for example, are performed, as well as the loading and unloading stations of the system. The last are usually in the form of cassette insertion and removal stations.

SUMMARY OF THE INVENTION

The solution of the above-mentioned problem is achieved, according to the invention, by providing an inserter of the type described above, in which:

(a) the main axis is surrounded by a housing in which an outer hollow shaft is rotatably disposed, with a central shaft coaxial therewith, the outer hollow shaft being co-rotational with the drive end of the lever and with the central shaft, there being a transmission mechanism which acts on a rotatable stubshaft belonging to the joint and supporting the outer part of the lever which has the holding end;

(b) one independently operated motor is connected with the hollow shaft and another is connected with the central shaft for respective independent rotation of these parts;

(c) the inner part of the lever is in the form of a hermetically sealed hollow body containing the mechanism that couples the central shaft to the stubshaft; and (d) the bearings of the hollow shaft and stubshaft are sealed from the interior of the vacuum system by at least low-friction, preferably friction-free, sealing elements.

With the system designed according to the invention not only is the number of friction points in the drive system drastically reduced, but also the friction points that remain are housed at locations which are outside of the vacuum and thus can also be lubricated. In this manner, a much better guidance of the individual moving parts relative to one another is achieved, and one which will stand up for a long period of operation, so that a very largely vibration free transport of the objects to be treated is possible. The subject matter of the invention is free of any detritus of particles that might enter the vacuum system.

By a precise control of the independent motors, for example by a microprocessor, a very precise movement of the holding end of the outer limb of the jointed lever is achieved, so that all points within a circular area can be reached by the paths of movement that are most desirable in each case. Since servo motors with tachogenerators and position indicator transmitters are used for the drive, commercially available controls, such as are commonly used in industrial robots and/or machine tools, can be used.

Instead of the above-mentioned servo motors, torque motors can be used which act directly on the coaxial hollow shaft and central shaft, so that the gear trains can be eliminated.

The teaching that the bearing points of the hollow shaft and of the stubshaft are sealed against the interior of the vacuum by at least low-friction sealing elements, includes the teaching of the use of friction-free sealing elements. Low-friction sealing elements are marketed, for example, in the form of sealing rings of elastomeric materials. A friction-free sealing system is known, for example, through the principle of "ferrofluid seals."

It is especially advantageous if the housing of the concentric shafts is hermetically attached to one wall of the vacuum system, which can be accomplished either fixedly by a sealing flange or flexibly and axially displaceably through a compensator. It is especially advantageous to use as the compensator a so-called bellows which, depending on its construction, permits a considerable axial movement without producing detritus from wear. The housing in this case is situated to special advantage outside of the vacuum chamber of the vacuum system.

An embodiment of the invention and its application are described hereinbelow with the aid of FIGS. 1 to 6.

DESCRIPTION OF THE PREFERRED EMBODIMENTS

Figure 1:
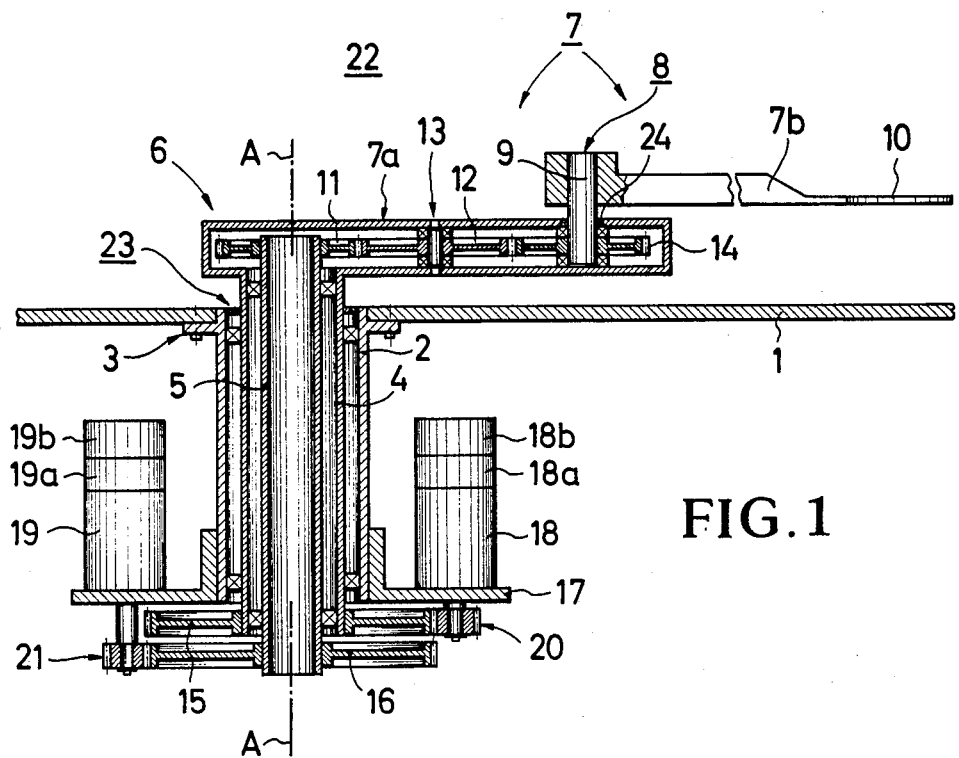
FIG. 1 is an axial cross-sectional view taken along the main axis through a complete inserter.

In FIG. 1 there is shown a wall 1, which is the bottom plate of a vacuum apparatus for example, of which the vacuum side is above the wall 1. On this wall a housing 2 is hermetically fastened by means of a flange 3. First an outer hollow shaft 4 is mounted in the housing 2 by means of roller bearings not specifically identified, and, coaxial therewith, an inner, central shaft 5. The hollow shaft 4 and the central shaft 5 define a main axis A—A. The central shaft 5 can be either in the form of a hollow shaft or a solid shaft.

The outer hollow shaft 4 is joined co-rotationally with the drive end 6 of a two-part lever arm 7. This lever arm consists of an inner part 7a and an outer part 7b, these being joined together by a joint 8. The joint 8 includes a stubshaft 9 which is mounted co-rotationally in the outer lever part 7b but rotatably in the inner lever part 7a. In this manner the lever part 7b can perform rotational movements about the main axis A—A and (superimposed) rotational movements about the joint 8. The free end of the lever part 7b forms a holder for an object, such as a wafer, for example. The holding end 10 is formed by a segment of a circular ring, as can be seen especially in FIG. 2.

As it can be seen in FIG. 1, the inner lever part 7a is configured as a hermetically sealed hollow body which contains a transmission mechanism forming the connection between the center shaft 5 and the stubshaft 9. For this purpose the center shaft 5 terminates in the cavity of the lever part 7a where it is provided with a co-rotational gear 11. This gear meshes with a second gear 12 which is mounted on a stub shaft 13 within lever part 7a. The second gear 12 in turn meshes with a third gear 14, which is co-rotational with the stubshaft 9. In this manner a rotational movement of the center shaft 5 is transmitted in the same sense to the stubshaft 9 and thus to the outer lever part 7b. The system of gears 11, 12 and 14 can also be replaced by a chain or belt drive.

The hollow shaft 4 is provided at its bottom end with an additional gear 15, while the bottom end of the center shaft 6 bears an additional gear 16, the attachment being co-rotational in each case, and the gears 15 and 16 being disposed coaxially. On the bottom end of the housing 2 there is a flange 17 on which two motors 18 and 19 are fastened with tachogenerators 18a and 19a and position indicating transmitters 18b and 19b, respectively. Motor 18 drives a pinion 20 which meshes with the gear 15, while motor 19 drives a pinion 21 which meshes with gear 16. The result is that in this manner any point within a circular area can be addressed with the holding end 10 by independent operation of the motors 18 and 19, as will be further explained below with the aid of FIG. 6. It is important that the drive system, consisting of the motors 18 and 19, the corresponding tachogenerators and position indicating transmitters be disposed outside of the vacuum chamber, i.e., underneath the wall 1.

The bearings of the hollow shafts 5 on the housing 2 on the one hand, and those of the stubshaft 9 on the inner lever part 7a, are sealed in the direction of the interior 22 of the vacuum system by sealing means 23 and 24 which are in the form of "Ferrofluid" seals and are of low friction and friction-free, respectively.

Figure 2:
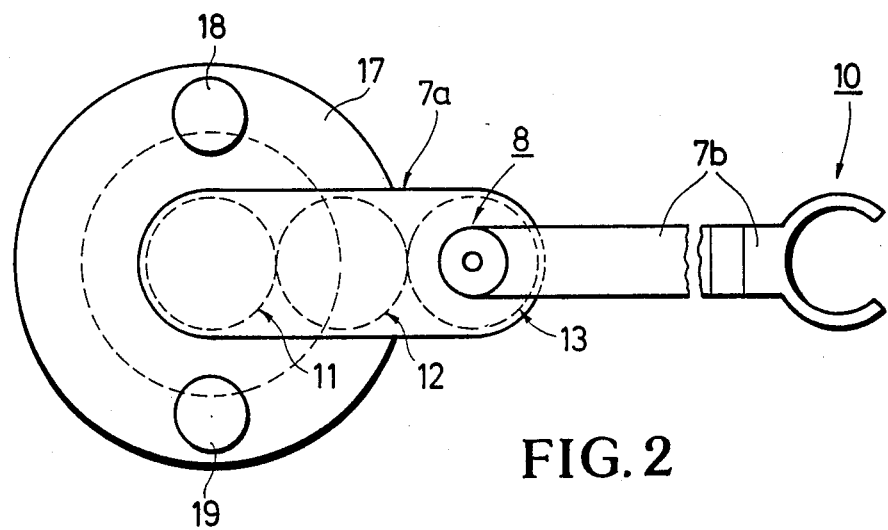
FIG. 2 is a top view of the inserter of FIG. 1.

In FIG. 2 parts identical to those in FIG. 1 are provided with the same reference numerals. The motors 18 and 19 are represented in a different position, but this in no way changes the principle of operation.

Figure 3:
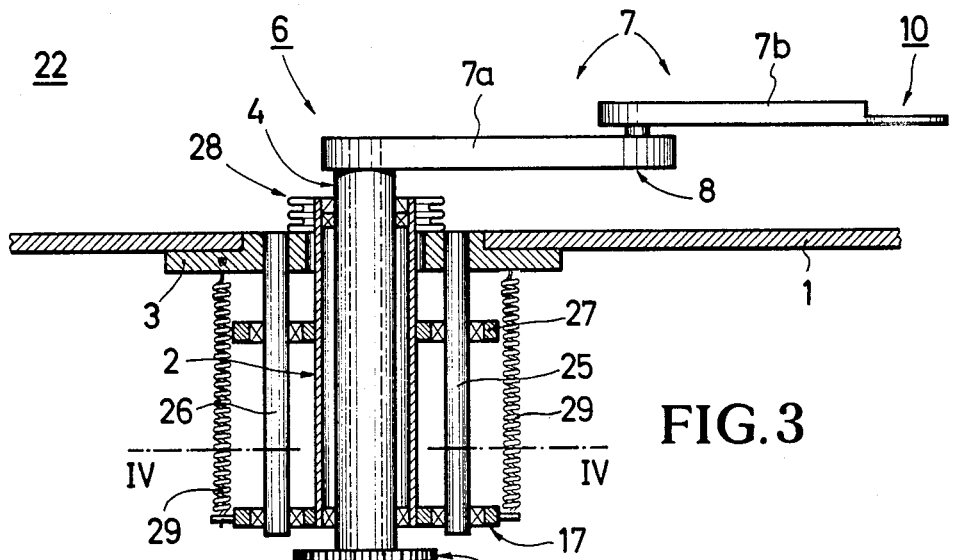
FIG. 3 is an axial cross-sectional view, taken along line III—III through the inserter of FIG. 4.
Figure 4:
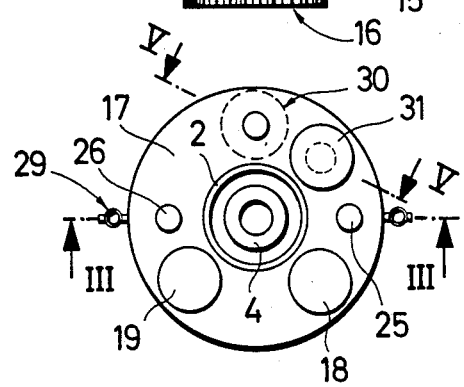
FIG. 4 is a cross-sectional view through the inserter of FIG. 3, taken along line IV—IV.
Figure 5:
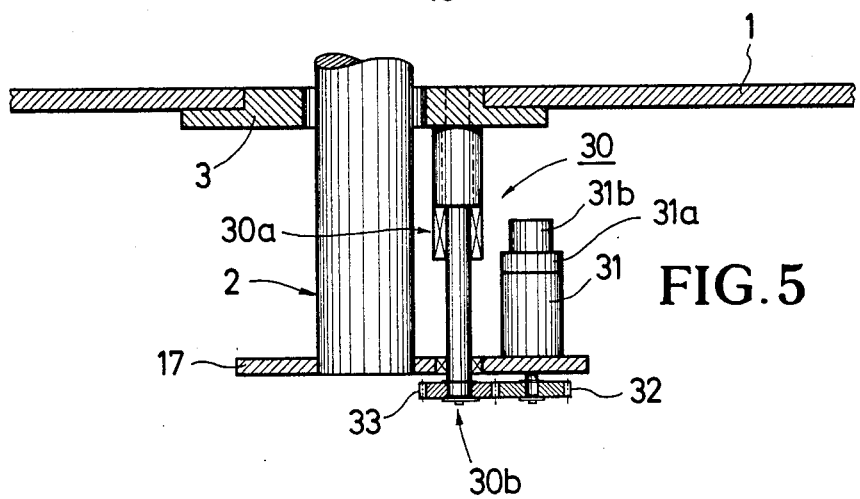
FIG. 5 is a partial cross-sectional view, taken along line V—V through the inserter of FIG. 4.

In FIGS. 3 to 5 parts serving the same or a similar function as in FIGS. 1 and 2 are provided with the same reference numerals. But the following additions are to be made to the apparatus shown in FIGS. 1 and 2:

The housing 2 is displaceable in an axis-parallel manner on guiding columns 25 and 26 parallel to the main axis A—A, by means of ball bearings not further indicated, of which one pair is disposed in the flange 17 and another pair in a guiding flange 27. In order to assure the required hermeticity, the upper end of the housing is connected hermetically to the flange 3 through a compensator 28 in the form of a bellows, and the flange in turn is hermetically inserted into the wall 1 of the vacuum chamber. By displacing the housing 2 in the direction of the main axis A—A it can be brought about that the lever arm 7 can be swung not only in one plane but in a great number of planes. In this manner it is possible to achieve not only a precise adjustment of the inserting apparatus but also the addressing of particular planes which are established, for example, by the insertion openings in the cassettes or magazines. Spring elements 29 serve for weight compensation so as to relieve the drive for the linear movement.

To produce this linear movement a spindle drive 30 with an additional motor 31 is provided, which is associated in like manner with a tachogenerator 31a and a displacement sender 31b. The spindle drive 30 consists of a spindle nut 30a in the form of a recirculating ball bearing, and of a threaded spindle 30b. The drive is transmitted by a pair of gears 32 and 33. The guiding columns 25 and 26 are fastened to the flange 3 as is also the spindle nut 30a.

Especially the cross section represented in FIG. 4 shows where the motors 18, 19 and 31, columns 25 and 26, and the spring elements 29, are fastened to the bottom flange 17. In FIG. 5 the motors 18 and 19 as well as the shafts 4 and 5 with their gears 15 and 16 and the pinions 20 and 21 meshing therewith have been omitted for the sake of simplicity. FIG. 3 also shows only gears 15 and 16 of the shafts 4 and 5. The construction and manner of operation, however, are the same as in FIG. 1.

Figure 6:
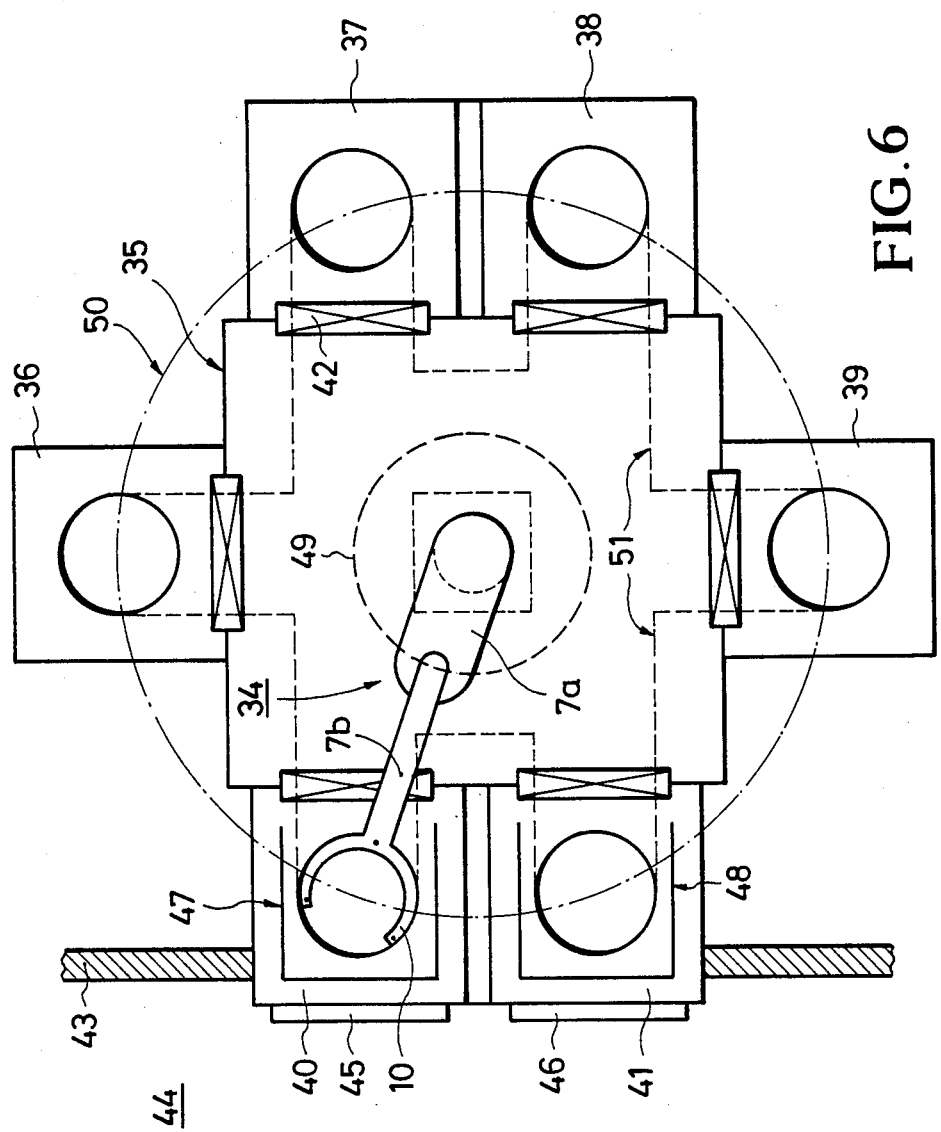
FIG. 6 is a top view of an inserter similar to that of FIG. 2, but on a smaller scale, and cooperating with a vacuum apparatus having several stations.

FIG. 6 shows an inserting apparatus 34 according to FIGS. 1 and 2 in use in a vacuum chamber 35 with which four processing chambers 36, 37, 38 and 39, distributed around the circumference, are associated. The apparatus also includes a cassette station 40 for the feeding of untreated substrates, and a cassette station 41 for receiving treated substrates. The processing chambers and cassette stations are likewise evacuable and connected to the vacuum chamber 35 through airlock valves 42. The cassette stations 40 and 41 penetrate a separating well 43 on whose left side the so-called "clean room" 44 is situated. The cassette stations 40 and 41 enter into this clean room by means of two additional airlock valves 45 and 46, through which the cassette stations can be loaded with cassettes or magazines 47 and 48, respectively.

The paths of movement of the holding end 10 are within a circular area defined by the concentric circles 49 and 50. It can thus be seen that the paths of movement of the holding end 10 extend all the way into the processing chambers and cassette stations where they can pick up and lay down the substrates. In an especially desirable manner, an envelope curve for the movement of the holding end 10 is defined by the broken line 51. Advantageously, the cassette stations each have a raising device whereby the substrate in question can be raised to a level at which it can be picked up by the holding end.

There has thus been shown and described a novel inserter for a vacuum installation which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follows.

What is claimed is:

1. In an inserter for vacuum installations, having a two-part arm which is provided with a driving end, a single joint and an end for holding an object, and which can turn in at least one horizontal plane about a vertical main axis disposed in the area of the driving end, said inserter having at least two motors for moving the arm about the main axis and changing the angle between the parts of the arm at the joint, the improvement wherein:
   (a) the main axis is surrounded by a housing in which an outer hollow shaft is rotatably disposed, with a central shaft coaxial therewith, the outer hollow shaft being co-rotational with the drive end of the arm and with the central shaft, there being a rotatable stubshaft belonging to the joint and supporting the outer part of the arm which has the holding end;
   (b) one independently operated motor is connected with the hollow shaft and another is connected with the central shaft for respective independent rotation of these parts;
   (c) the inner part of the arm is in the form of a hermetically sealed hollow body containing a transmission mechanism that couples the central shaft to the stubshaft; and
   (d) the bearings of the hollow shaft and stubshaft are sealed from the inner chamber of the vacuum system by at least low-friction, preferably friction-free, sealing element;
   (e) the housing is guided for axis-parallel displacement on guiding columns parallel to the main axis and is joined hermetically through a compensator to one wall of the vacuum system.

2. The inserter according to claim 1, wherein the hollow shaft and central shaft are each provided with a coaxial gear and the motors are fastened to the housing, each motor meshing through a pinion with the particular gear.

3. The inserter according to claim 2, wherein the housing is provided with a flange to which the motors are fastened.

4. The inserter according to claim 1, wherein a spindle drive is provided with an additional motor for axis-parallel displacement of the housing.

5. The inserter according to claim 4, wherein the additional motor is fastened to the flange.

* * * * *